US012690247B2

(12) United States Patent

Zota et al.

(10) Patent No.: US 12,690,247 B2

(45) Date of Patent: Jul. 21, 2026

(54) STEEP-SWITCHING TRANSISTOR INCLUDING THREE-DIMENSIONAL DIRAC ENERGY FILTER

(71) Applicant: International Business Machines Corporation, Armonk, NY (US)

(72) Inventors: Bogdan Cezar Zota, Rüschlikon (CH); Lorenzo Rocchino, Zurich (CH); Federico Balduini, Switzerland (CH); Heinz Schmid, Waedenswil (CH); Bernd W. Gotsmann, Horgen (CH)

(73) Assignee: International Business Machines Corporation, Armonk, NY (US)

( * ) Notice: Subject to any disclaimer, the term of this patent is extended or adjusted under 35 U.S.C. 154(b) by 357 days.

(21) Appl. No.: 18/531,808

(22) Filed: Dec. 7, 2023

(65) Prior Publication Data

US 2025/0194185 A1    Jun. 12, 2025

(51) Int. Cl.
| | |
|---|---|
| *H10D 62/13* | (2025.01) |
| *H10D 30/01* | (2025.01) |
| *H10D 30/43* | (2025.01) |
| *H10D 30/67* | (2025.01) |
| *H10D 62/10* | (2025.01) |

(52) U.S. Cl.
CPC ......... *H10D 62/151* (2025.01); *H10D 30/014* (2025.01); *H10D 30/43* (2025.01); *H10D 30/6735* (2025.01); *H10D 62/121* (2025.01)

(58) Field of Classification Search
None
See application file for complete search history.

(56) References Cited

U.S. PATENT DOCUMENTS

| | | | |
|---|---|---|---|
| 9,704,977 B2 | 7/2017 | Koh et al. | |
| 11,239,073 B2 | 2/2022 | Fuhrer et al. | |
| 2009/0200540 A1 | 8/2009 | Bjoerk et al. | |
| 2020/0321471 A1* | 10/2020 | Liang ................ | H10D 30/6713 |
| 2020/0328283 A1* | 10/2020 | Liang ................ | H10D 30/031 |
| 2021/0210639 A1* | 7/2021 | Liu ..................... | H10D 30/6743 |
| 2023/0022711 A1* | 1/2023 | Lu ...................... | H10D 30/6713 |
| 2023/0238328 A1 | 7/2023 | Alberi et al. | |

OTHER PUBLICATIONS

Datta et al,. "Toward attojoule switching energy in logic transistors." Science 378.6621 (2022): pp. 1-8.

(Continued)

*Primary Examiner* — Nishath Yasmeen

(74) *Attorney, Agent, or Firm* — CANTOR COLBURN LLP; Samuel Waldbaum

(57) ABSTRACT

A semiconductor structure includes a nanosheet stack on a substrate. The nanosheet stack has alternating layers of channel nanosheets and sacrificial nanosheets, which are formed between a first source/drain (S/D) region and a second S/D region. The semiconductor structure further includes a gate structure on the nanosheet stack, and a three-dimensional (3D) Dirac energy filter. The three-dimensional (3D) Dirac energy filter is formed on a portion of the substrate located in the first S/D region and includes a portion that contacts the nanosheet stack. A first S/D is on the 3D Dirac energy filter in the first S/D region, and a second S/D is on the substrate of the second S/D region.

7 Claims, 13 Drawing Sheets

(56) References Cited

OTHER PUBLICATIONS

Liu et al. "Two-dimensional cold electron transport for steep-slope transistors." ACS nano 15.3 (2021): 45 pages.

Qiu et al. "Dirac-source field-effect transistors as energy-efficient, high-performance electronic switches." Science 361.6400 (2018): 387-392.

Thewissen et al., "The Miniband Alignment Field-Effect Transistor: a superlattice-based steep-slope nanowire FET." arXiv preprint arXiv:1609.09372 (2016): 9 pages.

Wu et al., "Design Considerations for 2D Dirac-Source FETs: Device Parameters, Non-Idealities and Benchmarking." arXiv preprint arXiv:2203.11248 (2022), 10 pages.

* cited by examiner

2000

2008

2018

2014

2016

2020

ILD        2018

2015

3D-Dirac        Semiconductor channel        2004

Substrate        2002

2012

2000

2022        2008

2018

2014

2016

High-k
metal
gate

ILD        2018

2015

3D-Dirac        Semiconductor channel        2004

Substrate        2002

2012        2024  2026

STEEP-SWITCHING TRANSISTOR INCLUDING THREE-DIMENSIONAL DIRAC ENERGY FILTER

BACKGROUND

The present disclosure relates in general to fabrication methods and resulting structures for semiconductor devices. More specifically, the present disclosure relates to fabrication methods and resulting structures for providing a steep-switching transistor including a three-dimensional Dirac energy filter.

The continuous advancement in semiconductor technology, driven by Moore's Law which predicts the doubling of transistors on integrated circuits every two years, is encountering significant challenges. Steep-switching transistors are semiconductor structures, which have been developed with the aim of overcoming some of these challenges to extend the long-term outlook of Moore's law. A steep-switching transistor, often referred to as a steep-slope transistor, is a specialized electronic device that utilizes innovative materials such two-dimensional (2D) materials that provide high carrier mobility capable of facilitating rapid and energy-efficient switching between its on and off states. Unlike conventional transistors, which have a gradual transition between these states, steep-switching transistors offer an extremely sharp and near-vertical transition, resulting in increased switching speeds and reduced power consumption at a smaller device footprint compared to traditional transistors.

SUMMARY

A semiconductor structure includes a nanosheet stack on a substrate. The nanosheet stack has alternating layers of channel nanosheets and sacrificial nanosheets, which are formed between a first source/drain (S/D) region and a second S/D region. The semiconductor structure further includes a gate structure on the nanosheet stack, and a three-dimensional (3D) Dirac energy filter. The three-dimensional (3D) Dirac energy filter is formed on a portion of the substrate located in the first S/D region, and extends from the substrate and contacts the nanosheet stack. A first S/D is on the 3D Dirac energy filter in the first S/D region, and a second S/D is on the substrate of the second S/D region.

According to another non-limiting embodiment, A method of fabricating a semiconductor structure comprises forming a nanosheet stack over a substrate and forming a gate structure on the nanosheet stack. The nanosheet stack includes alternating layers of channel nanosheets and sacrificial nanosheets between a first source/drain (S/D) region and a second S/D region. The method further includes forming a three-dimensional (3D) Dirac energy filter comprising a 3D Dirac material on a portion of the substrate located in the first S/D region. The 3D Dirac energy filter extends from the substrate and contacts the nanosheet stack. The method further comprises forming a first S/D on the 3D Dirac energy filter in the first S/D region, and forming a second S/D on the substrate of the second S/D region.

According to yet another non-limiting embodiment, A semiconductor structure comprises a semiconductor channel on a semiconductor substrate, and a gate structure on the semiconductor channel, where the gate channel is between a first source/drain (S/D) region and a second S/D region. The semiconductor structure further comprises a three-dimensional (3D) Dirac energy filter on a portion of a substrate located in the first S/D region. The semiconductor structure further comprises a first S/D on the 3D Dirac energy filter in the first S/D region, a second S/D on the semiconductor channel in the second S/D region, and an interlayer dielectric (ILD) on the first S/D and the second S/D.

Additional features and advantages are realized through techniques described herein. Other embodiments and aspects are described in detail herein. For a better understanding, refer to the description and to the drawings.

BRIEF DESCRIPTION OF THE DRAWINGS

The subject matter which is regarded as embodiments is particularly pointed out and distinctly claimed in the claims at the conclusion of the specification. The foregoing and other features and advantages of the embodiments are apparent from the following detailed description taken in conjunction with the accompanying drawings in which:

FIGS. 1-8 depict diagrams related to a nanosheet-based structure after various fabrication operations for providing a steep-switching transistor including a three-dimensional Dirac energy filter in accordance with non-limiting embodiments of the present disclosure, in which:

FIG. 1 depicts a cross-sectional view of a nanosheet-based structure after initial fabrication operations in accordance with aspects of the present disclosure;

FIG. 2 depicts a cross-sectional view of a nanosheet-based structure after additional fabrication operations in accordance with aspects of the present disclosure;

FIG. 3 depicts a cross-sectional view of a nanosheet-based structure after additional fabrication operations in accordance with aspects of the present disclosure;

FIG. 4 depicts a cross-sectional view of a nanosheet-based structure after depositing a spacer layer in accordance with aspects of the present disclosure;

FIG. 5 depicts a cross-sectional view of a nanosheet-based structure after depositing a spacer layer in accordance with aspects of the present disclosure;

FIG. 6 depicts a cross-sectional view of a nanosheet-based structure after depositing a spacer layer in accordance with aspects of the present disclosure;

FIG. 7 depicts a cross-sectional view of a nanosheet-based structure after depositing a spacer layer in accordance with aspects of the present disclosure; and FIG. 8 depicts a cross-sectional view of a nanosheet-based structure after depositing a spacer layer in accordance with aspects of the present disclosure.

FIGS. 9-17 depict diagrams related to a nanosheet-based structure after various fabrication operations for providing a steep-switching transistor including a three-dimensional Dirac energy filter in accordance with non-limiting embodiments of the present disclosure, in which:

FIG. 9 depicts a cross-sectional view of a nanosheet-based structure after initial fabrication operations in accordance with aspects of the present disclosure;

FIG. 10 depicts a cross-sectional view of a nanosheet-based structure after additional fabrication operations in accordance with aspects of the present disclosure;

FIG. 11 depicts a cross-sectional view of a nanosheet-based structure after additional fabrication operations in accordance with aspects of the present disclosure;

FIG. 12 depicts a cross-sectional view of a nanosheet-based structure after initial fabrication operations in accordance with aspects of the present disclosure;

FIG. 13 depicts a cross-sectional view of a nanosheet-based structure after initial fabrication operations in accordance with aspects of the present disclosure;

FIG. 14 depicts a cross-sectional view of a nanosheet-based structure after initial fabrication operations in accordance with aspects of the present disclosure;

FIG. 15 depicts a cross-sectional view of a nanosheet-based structure after initial fabrication operations in accordance with aspects of the present disclosure;

FIG. 16 depicts a cross-sectional view of a nanosheet-based structure after initial fabrication operations in accordance with aspects of the present disclosure; and FIG. 17 depicts a cross-sectional view of a nanosheet-based structure after initial fabrication operations in accordance with aspects of the present disclosure.

DETAILED DESCRIPTION

Figure 1:
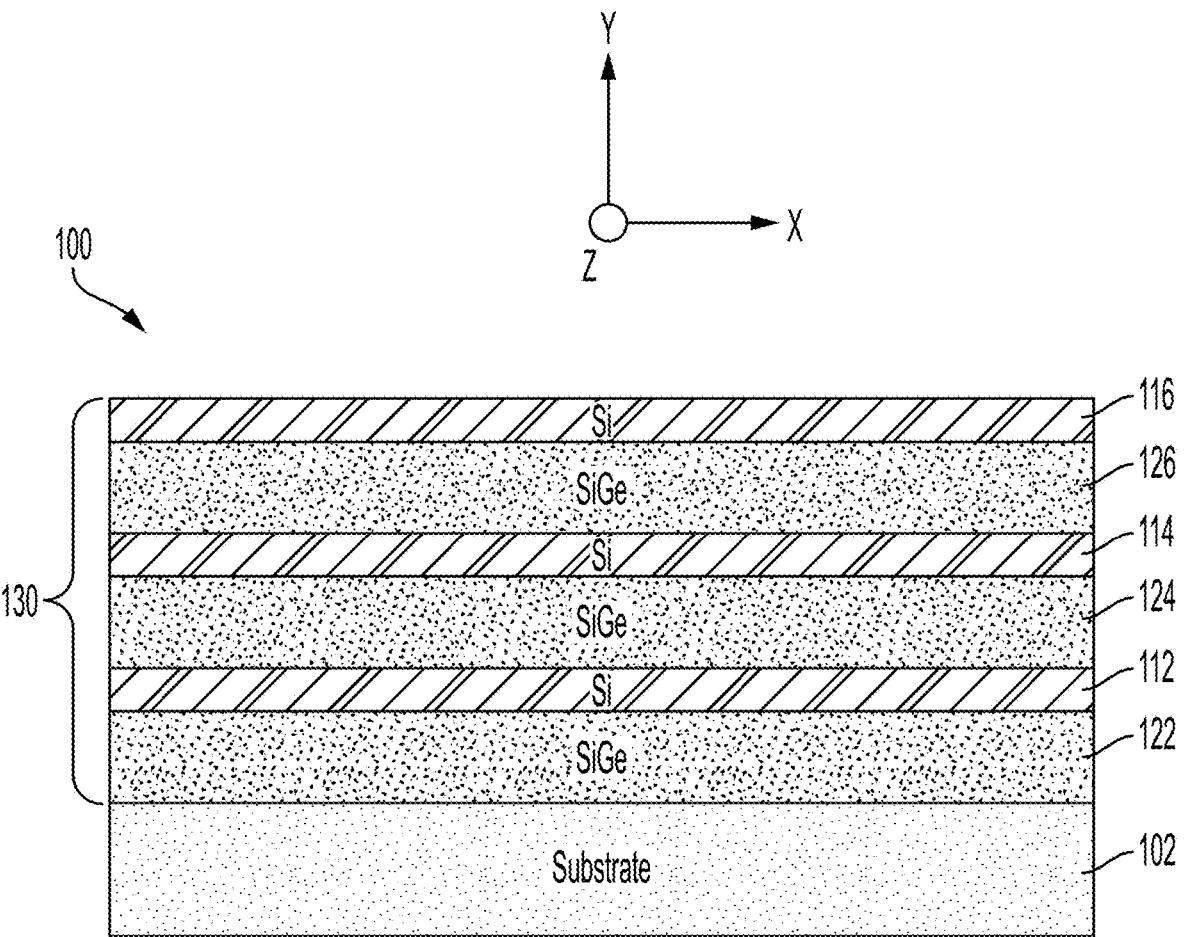

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to a description of technologies that are more specifically relevant to the present disclosure, steep-switching transistors are semiconductor structures, which have the potential to contribute to the goal of meeting the long-term outlook of Moore's Law by providing faster switching speeds, enabling higher computational performance, and reducing power consumption at reduced device footprints. These advantages collectively contribute to the sustained trend of improving computational power and density in accordance with Moore's Law, despite the challenges of shrinking conventional silicon-based transistors.

Conventional transistor technologies, such as standard Si CMOS, however, face one primary hurdle pertaining to the stagnation in voltage scaling, known as the end of Dennard scaling. This stagnation is largely due to the inherent limitations in the fundamental physics of MOSFET (Metal-Oxide-Semiconductor Field-Effect Transistor) devices. Specifically, the issue arises from thermal excitation in MOSFETs, leading to a tail of high-energy electrons and a consequent trailing off-current. This phenomenon restricts the subthreshold slope to a minimum of 60 m V/decade at room temperature, hindering capabilities to further reduce the scaling of steep-switching transistors.

Turning now to an overview of aspects of the present disclosure, embodiments of the disclosure provide fabrication methods and resulting structures for fabricating a steep-switching transistor including three-dimensional (3D) Dirac energy filter. The 3D Dirac energy filter is formed from a 3D Dirac material, which can operate as a reduced temperature element or "cold source". The 3D Dirac energy filter is formed in a source region of the transistor so that it can perform energy filtering by operating as a Fermi-filter that filters out hot carriers from entering the transistor channel. In addition, the Dirac energy filter is formed with an asymmetrical design, i.e., is formed in a first source/drain region (e.g., the source region), but not in a second source/drain region (e.g., the drain region) The asymmetrical design avoids drain-side electron filtering and minimizes the rethermalization current, i.e., prevents the rethermalization of carriers prior to injection through transistor channel which would otherwise hinder the ability to reduce the subthreshold slope below 60 m V/decade.

Turning now to a more detailed description of fabrication operations and resulting structures according to aspects of the disclosure, FIGS. 1-8 depict a semiconductor structure 100 (e.g., a nanosheet-based semiconductor structure) after various fabrication operations for forming a steep-switching transistor including three-dimensional (3D) Dirac energy filter. Although the diagrams depicted in FIGS. 1-8 are two-dimensional, it is understood that the structures depicted in FIGS. 1-8 are three-dimensional. The x/y/z diagram depicted in the figures is to represent that the various elements depicted in FIGS. 1-8 extend along a first axis (e.g., x-axis) to define width (or lateral) dimensions, extend along a second axis (e.g., y-axis) perpendicular to the x-axis to define height (or vertical) dimensions, and extend along a third axis (e.g., z-axis) perpendicular to the first axis and the second axis to define depth dimensions. In accordance with standard semiconductor fabrication operations, various elements of the fabrication stages depicted in FIGS. 1-8 extend completely around other elements in the x-axis, y-axis, and z-axis directions. For example, the gate structures (e.g., gate dielectric 206, dummy gate 202, and gate spacers 204) shown in FIG. 2 extend over and around the stack 130. The specifics of known three-dimensional structures for gate all-around (GAA) nanosheet FET architectures are known to those skilled in the relevant arts.

With reference now to FIG. 1, a cross-sectional view of a semiconductor structure 100 is illustrated after initial fabrication operations in accordance with aspects of the present disclosure. As shown in FIG. 1, a nanosheet stack 130 is formed over a substrate 102. In the illustrated embodiments of the disclosure, the substrate 102 includes a bulk silicon (Si) material. Alternatively, the substrate 102 can be implemented in a semiconductor-on-insulator (SOI) configuration. Other suitable semiconductor materials can be used as the substrate 102, including but not limited to monocrystalline silicon (Si), silicon germanium (SiGe), III-V compound semiconductors, II-VI compound semiconductors, and the like. In some embodiments of the disclosure where the substrate 102 is an SOI configuration, the substrate 102 includes a buried oxide layer (not depicted). The buried oxide layer can be made of any suitable dielectric material, such as, for example, a silicon oxide (SiO2).

The nanosheet stack 130 includes alternating layers of channel nanosheets 112, 114, 116 (e.g., Si nanosheet layers) and sacrificial nanosheet 122, 124, 126 (e.g., SiGe nanosheet layers). The channel nanosheet layers 112, 114, 116 have opposing end regions 113, and the sacrificial nanosheet layers 122, 124, 126 having opposing end regions 123. In accordance with aspects of the disclosure, the nanosheet stack 130 is epitaxially grown from the substrate 102. The alternating layers of nanosheets 122, 112, 124, 114, 126, 116 of the nanosheet stack 130 are formed by epitaxially growing one layer and then the next until the desired number and desired thicknesses of the nanosheet layers are achieved. Although six alternating layers of nanosheets 122, 112, 124, 114, 126, 116 are depicted in the figures, any number of alternating layers can be provided. Various known epitaxy techniques can be utilized to grow epitaxial materials from gaseous or liquid precursors. For example, epitaxial materials can be grown using vapor-phase epitaxy (VPE), molecular-beam epitaxy (MBE), liquid-phase epitaxy (LPE), or other suitable process. Epitaxial silicon (Si), silicon germanium (SiGe), and/or carbon doped silicon (Si:C) silicon can be doped during deposition (in-situ doped) by adding dopants, n-type dopants (e.g., phosphorus or arsenic) or p-type dopants (e.g., boron or gallium), depending on the type of transistor.

Figure 2:
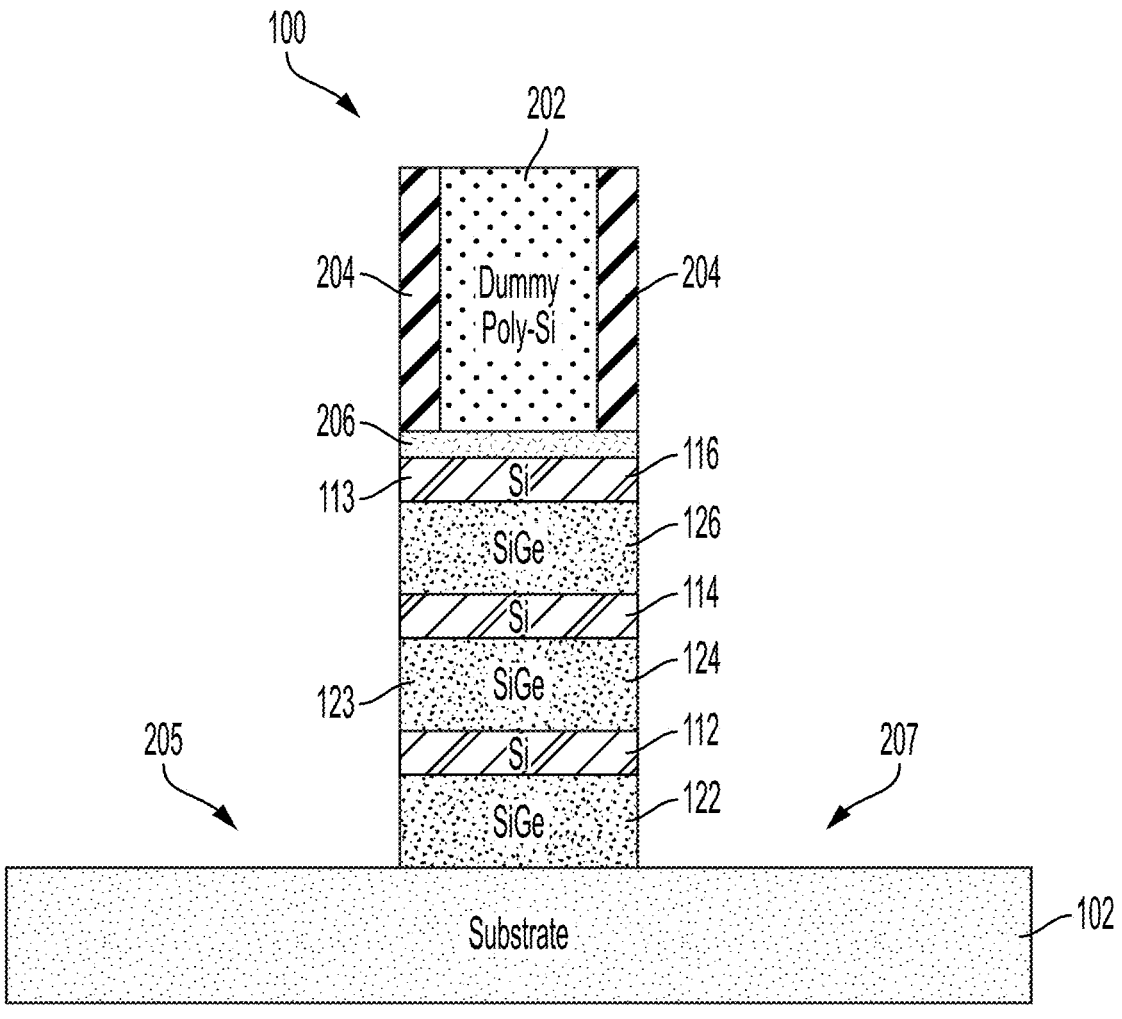

In FIG. 2, known fabrication operations have been used to form a gate dielectric 206, a dummy gate 202, and gate spacers 204 over a selected portion of the nanosheet stack 130. The portion of the nanosheet stack 130 that is still exposed is etched to form the semiconductor structure 100 shown in FIG. 2. According a non-limiting embodiment of the present disclosure, the gate dielectric 206 can be formed by depositing a dielectric layer (e.g., an oxide) (not shown) everywhere on the semiconductor structure 100. The dielectric layer, which will be etched in subsequent fabrication operations to form the gate dielectric 206, can be deposited conformally using any suitable conformal deposition process (e.g., atomic layer depositions (ALD)), and can include interfacial layers (IL) and high-k dielectric layers. A layer of amorphous silicon (a-Si) (not shown) is deposited over the dielectric layer. The a-Si layer is planarized then patterned (e.g., using a hard mask (not shown)) and etched using, for example, a dry etch, or a combination of sequential dry and wet etches to form the dummy gate 202. The gate spacers 204 are formed on sidewalls of the dummy gate 202 using, for example, CVD, PECVD, ALD, PVD, chemical solution deposition, or other like processes in combination with a wet or dry etch process. In embodiments of the disclosure, the gate spacers 204 can be silicon nitride (SiN), silicon boron carbonitride (SiBCN), or other similar materials.

Referring still to FIG. 2, the gate spacers 204 and the dummy gate 202 have been used as a mask, and the portions of the nanosheet stack 130 that are not covered by the gate spacers 204 and the dummy gate 202 are removed using any suitable removal process to form the gate dielectric 206. Wet or dry etch processes can be applied in order to etch the exposed portions of the nanosheet stack 130, thereby reducing the footprint of the nanosheet stack 130 and converting the nanosheet stack 130 into an elongated fin-shaped column having its long dimension extending along the z-axis. Accordingly, exposed portions of the substrate 102 define a first source/drain (S/D) region 205 and a second S/D region 207. In at least one non-limiting embodiment, the first S/D region 205 serves as a source region for supporting the source of the transistor and the second S/D region 207 serves as a drain region for supporting the drain of the transistor. It should be appreciated, however, that the first S/D region 205 can support the drain and the second S/D region 207 can support the source without departing from the scope of the present disclosure.

Figure 3:
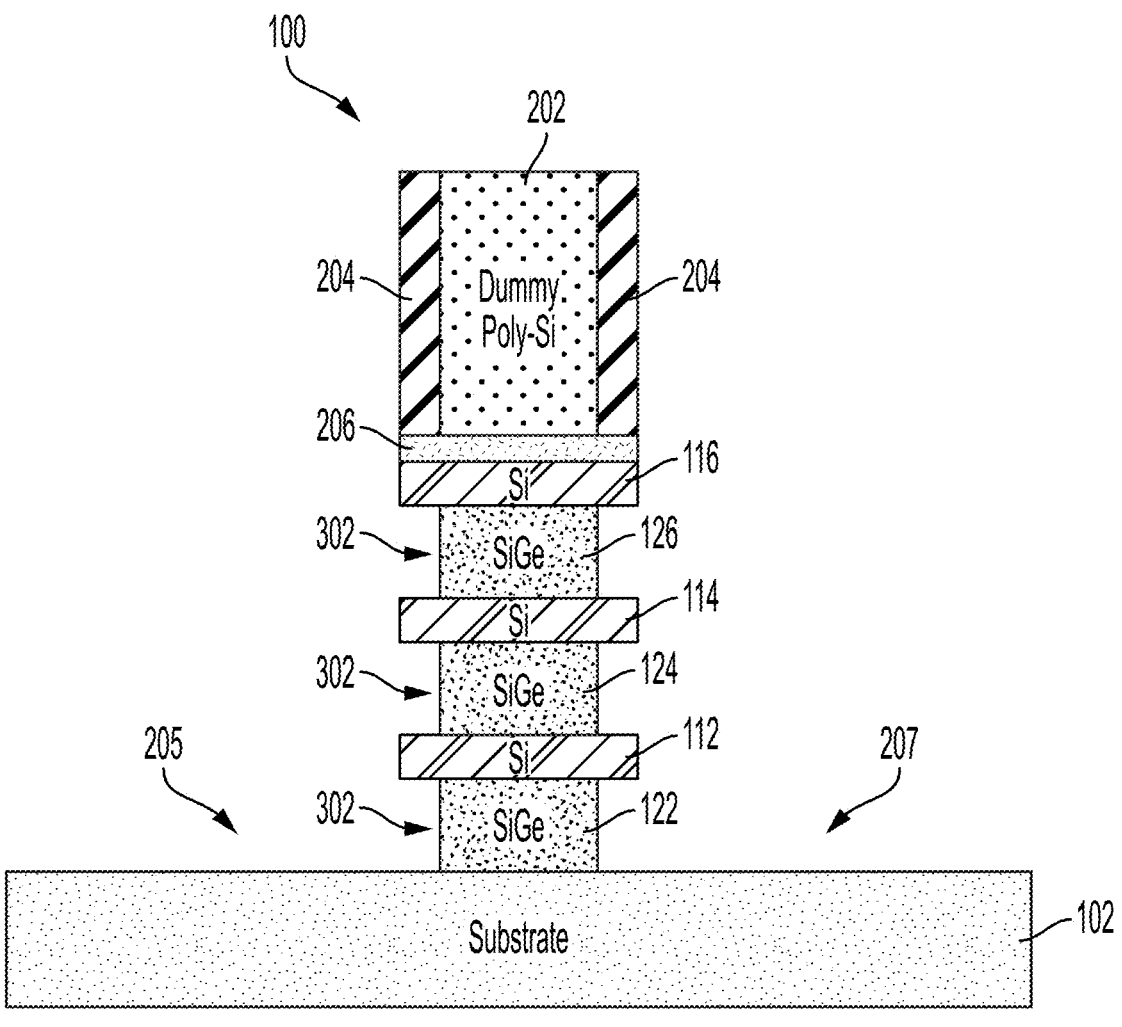

In FIG. 3, known semiconductor fabrication processes have been used to partially remove end regions of the sacrificial nanosheet 122, 124, 126 (e.g., SiGe sacrificial nanosheets) to form cavities 302. In embodiments of the disclosure, the end regions of the sacrificial nanosheets 122, 124, 126 can be removed using a first application of a so-called "pull-back" process to pull the sacrificial nanosheet 122, 124, 126 back an initial pull-back distance such that the ends of the sacrificial nanosheets 122, 124, 126 now terminate at an inner edge of the gate spacers 204. In non-limiting embodiments of the disclosure, the pull-back process leverages the fact that the sacrificial nanosheets 122, 124, 126 are formed from SiGe, which can be selectively etched with respect to the Si channel nanosheet 112, 114, 116 using, for example, a standard cleaning 1 (SC-1) or a vapor phase hydrogen chloride (HCl) gas isotropic etch process.

Figure 4:
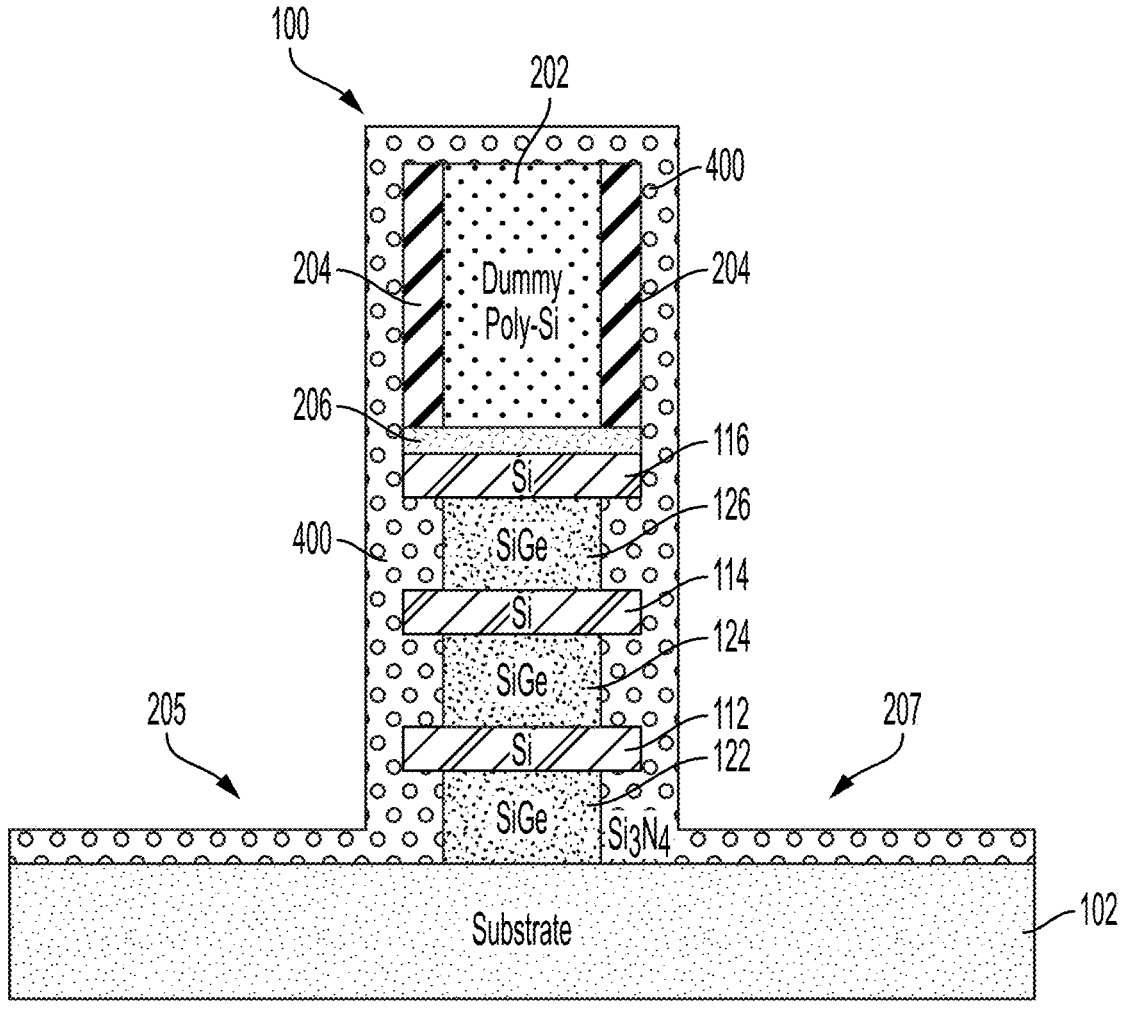

In FIG. 4, the semiconductor structure 100 is covered with an spacer layer 400. In non-limiting embodiments of the disclosure, the spacer layer 400 is formed by depositing a spacer material using a conformal deposition process. The conformally deposited spacer material completely fills the cavities 302 and covers the first S/D region 205 and second S/D region 207. The spacer material 400 can include various dielectric materials including, but not limited to, silicon nitride (SiN), silicoboron carbonitride, silicon carbonitride, silicon carbon oxynitride, or any other type of dielectric material having a dielectric constant k of less than about 5.

Figure 5:
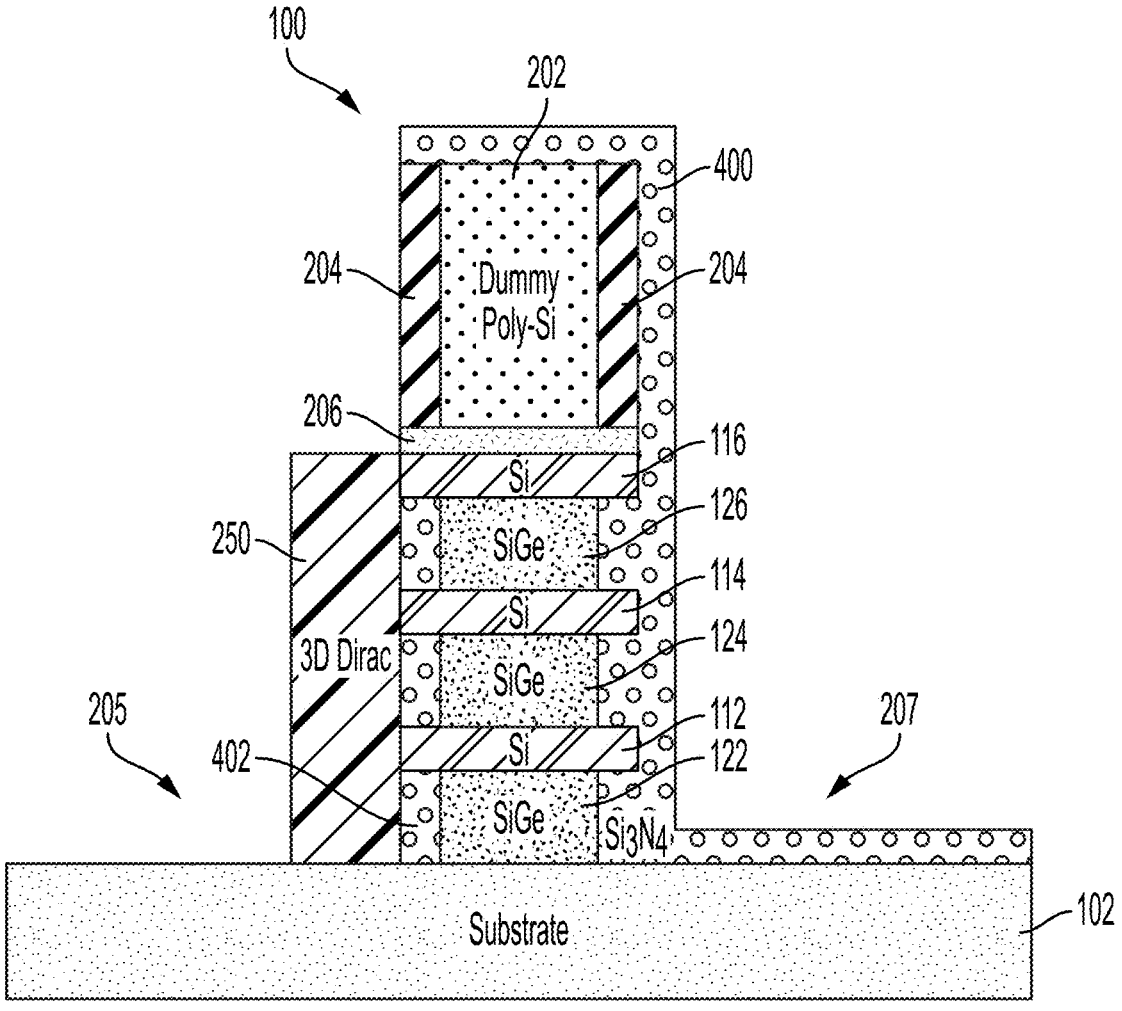

Turning to FIG. 5, the semiconductor structure 100 is shown after removing a portion of the spacer layer 400 located in the first S/D region 205. The portion of the spacer layer 400 can be removed by masking a first portion of the 400 covering the gate spacers 204, the dummy gate 202, and the second S/D region 207, and then performing a subsequent isotropic or anisotropic etch that etches the exposed spacer layer 400 selective to the material of the gate spacers 204, the gate dielectric 206, the channel nanosheets 112, 114, 116, (e.g., Si channel nanosheets) and the substrate 102. As a result, the spacer layer 400 is removed from the channel nanosheets 112, 114, 116 and the upper surface of the substrate 102 located in the first S/D region 205, while the remaining portion of the spacer layer 400 filling the cavities 302 defines inner spacers 402 that are formed directly against the end regions of the sacrificial nanosheets 122, 124, 126.

With continued reference to FIG. 5, a 3D Dirac energy filter 250 is formed in the first S/D region 205 (e.g., the source region) after removing the portion of the spacer layer 400, and can serve as a 3D Dirac "cold source" capable of injecting charge carriers (holes/electrons) into the channel from a linear 3D Dirac energy cone, which is a beneficial attribute for reducing power consumption in transistors.

According to a non-limiting embodiment of the present disclosure, the 3D Dirac energy filter 250 is formed by epitaxially growing a 3D Dirac material (e.g. a 3D Dirac semimetal) from an upper surface of the exposed substrate 102 (e.g., Si substrate 102) and the exposed end regions of the channel nanosheets 112, 114, 116. Various known epitaxy techniques described herein can be utilized to grow 3D material. The 3D material used to form the 3D Dirac energy filter 2012 can include, but is not limited to, cobalt monosilicide (CoSi), Calcium arsenide ($Ca_3As_2$), niobium phosphate (NbP), tungsten diphosphide ($WP_2$) and Molybdenum Phosphide ($MoP_2$). According to a non-limiting embodiment, the 3D Dirac energy filter 2012 can have a vertical height (e.g., extending along the Y-axis) ranging, for example, from about 20 nm to about 200 nm, and a horizontal thickness (e.g., extending along the X-axis) ranging, for example, from about 20 nm to about 100 nm.

Figure 6:
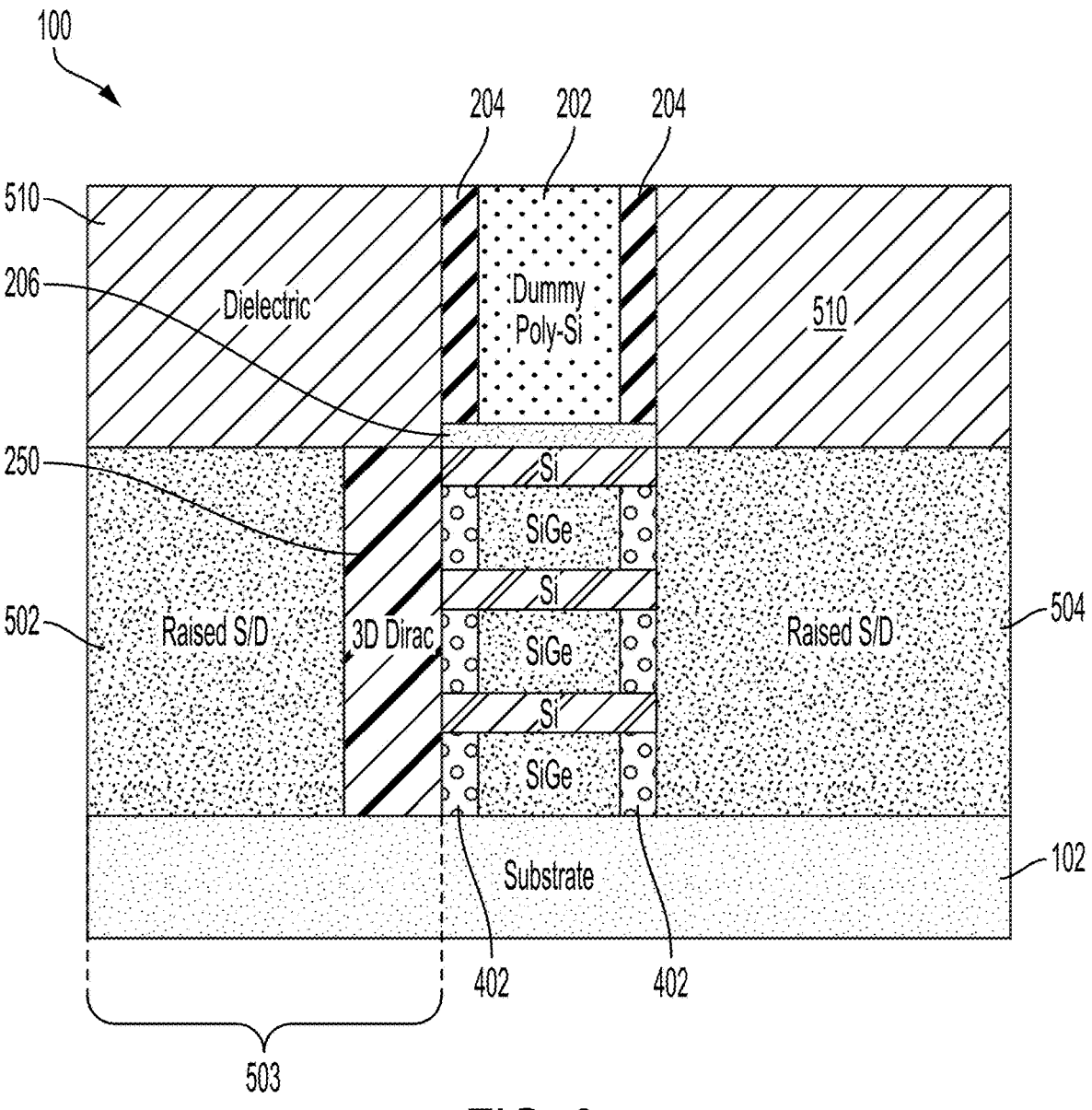

Turning to FIG. 6, the semiconductor structure 100 is shown following the formation of a first S/D 502 in the first S/D region 205 and a second S/D 504 in the second S/D region 207. As shown in FIG. 6, the 3D Dirac energy filter 250 and the first S/D 502 define a stacked S/D 503 (e.g., horizontally stacked S/D), where the first S/D 502 is asymmetrical with respect to the second S/D 504 (e.g., the amount of S/D material used to form the first S/D 502 is different from (e.g., less than) the amount of material used to form the second S/D 504).

According to a non-limiting embodiment, the first S/D 502 can be epitaxially grown from the exposed surface of the substrate 102 (e.g., Si substrate). Various known epitaxy techniques described herein can be utilized to grow the first S/D 502. In some non-limiting embodiments of the disclosure, the first S/D region 502 is formed from Si, or SiGe, for example, and can be doped during deposition (in-situ doped) by adding dopants such as n-type dopants (e.g., phosphorus or arsenic) to form an n-type device, or p-type dopants (e.g., B, Ga, Id, or Al) to form a p-type device. In some non-limiting embodiments, the epitaxial material can also be grown from exposed surfaces of the 3D Dirac energy filter 250, and a CMP process can then be applied so that the upper surfaces of the first S/D region 502 and the 3D Dirac energy filter 250 are planar (e.g. "flush") with respect to one another.

The second S/D 504 is formed in the second S/D region 207 after removing the remaining portion of the spacer layer 400 from the end regions of the channel nanosheets 112, 114, 116 and the upper surface of the substrate 102. The remaining spacer layer 400 can be removed using similar methods used to remove the spacer layer 400 from the first S/D region 205 such that the details of the etching process will not be repeated for the sake of brevity. Accordingly, the second S/D 504 can be epitaxially grown from the end regions of the channel nanosheets 112, 114, 116 and the upper surface of the substrate 102 (e.g., Si substrate). Various known epitaxy techniques described herein can be utilized to grow the second S/D 504. In some non-limiting embodiments of the disclosure, the second S/D region 504 is formed from Si, or SiGe, for example, and can be doped during deposition (in-situ doped) by adding dopants such as n-type dopants (e.g., phosphorus or arsenic) to form an n-type device, or p-type dopants (e.g., B, Ga, Id, or Al) to form a p-type device.

As shown in FIG. 6, the size of the first S/D 502 is different (e.g. smaller) than the size of the second S/D 504 due to the formation of the 3D Dirac energy filter 250 between the first S/D 502 and the nanosheet stack 130, and thus the different amount of material used to form the first S/D 502 compared to the second S/D 504. While the different sized source/drains do not impact device performance, they can serve as a sort of physical signature of the process for providing a steep-switching transistor including a three-dimensional Dirac energy filter as described herein.

Figure 7:
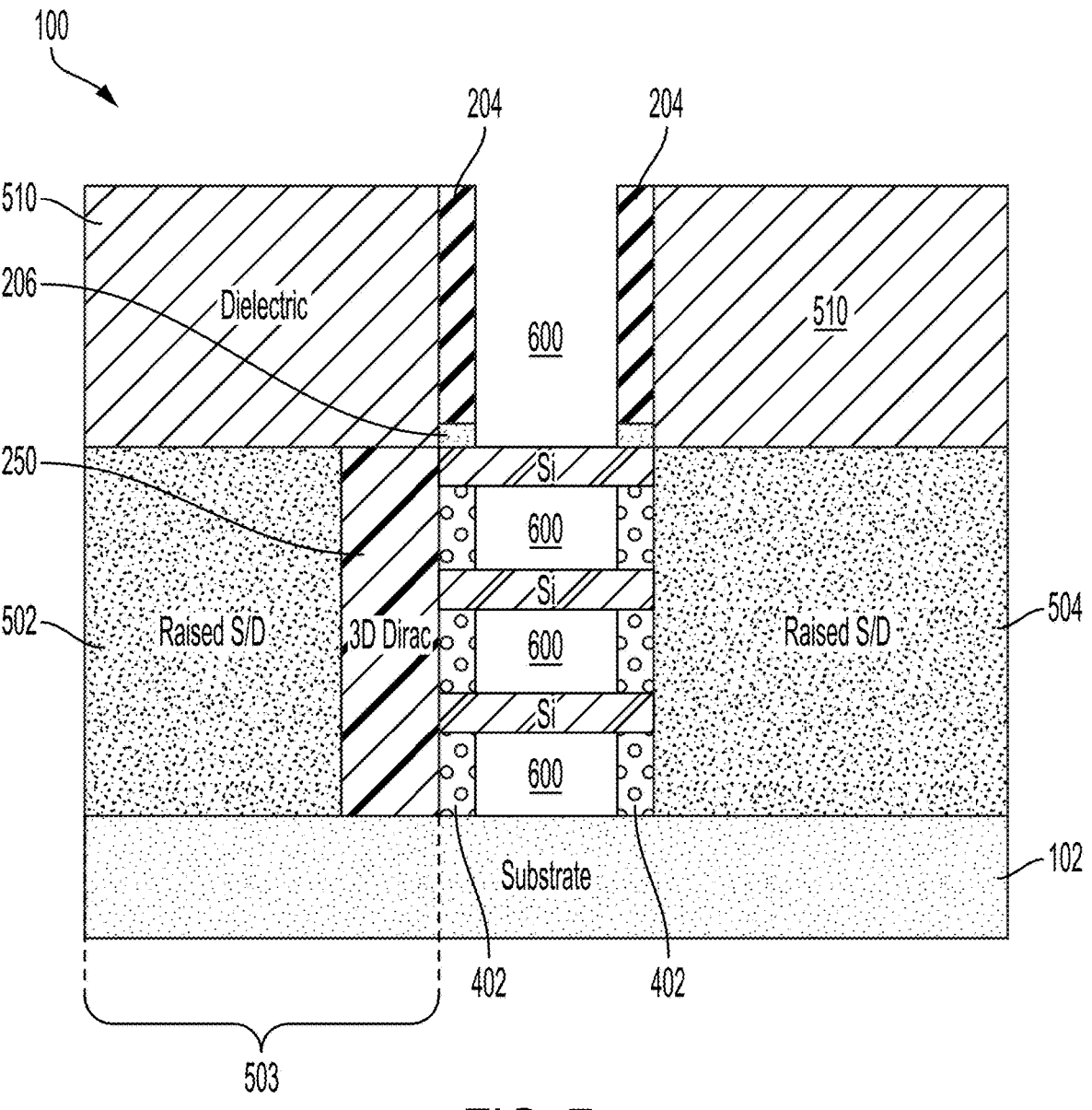

In FIG. 7, the dummy gate 202 and a portion of the gate dielectric 206 that was under the dummy gate 202 have been removed. The dummy gate 202 and the gate dielectric 206 can be removed by a known etching process, e.g., RIE or chemical oxide removal (COR). Known semiconductor fabrication operations have also been used to remove the sacrificial nanosheets 122, 124, 126. In embodiments of the disclosure, the sacrificial nanosheets 122, 124, 126 are formed from SiGe, which can be selectively etched with respect to the channel nanosheets 112, 114, 116 using, for example, a vapor phase hydrogen chloride (HCL) gas isotropic etch process or hot SC-1 wet chemistry.

Figure 8:
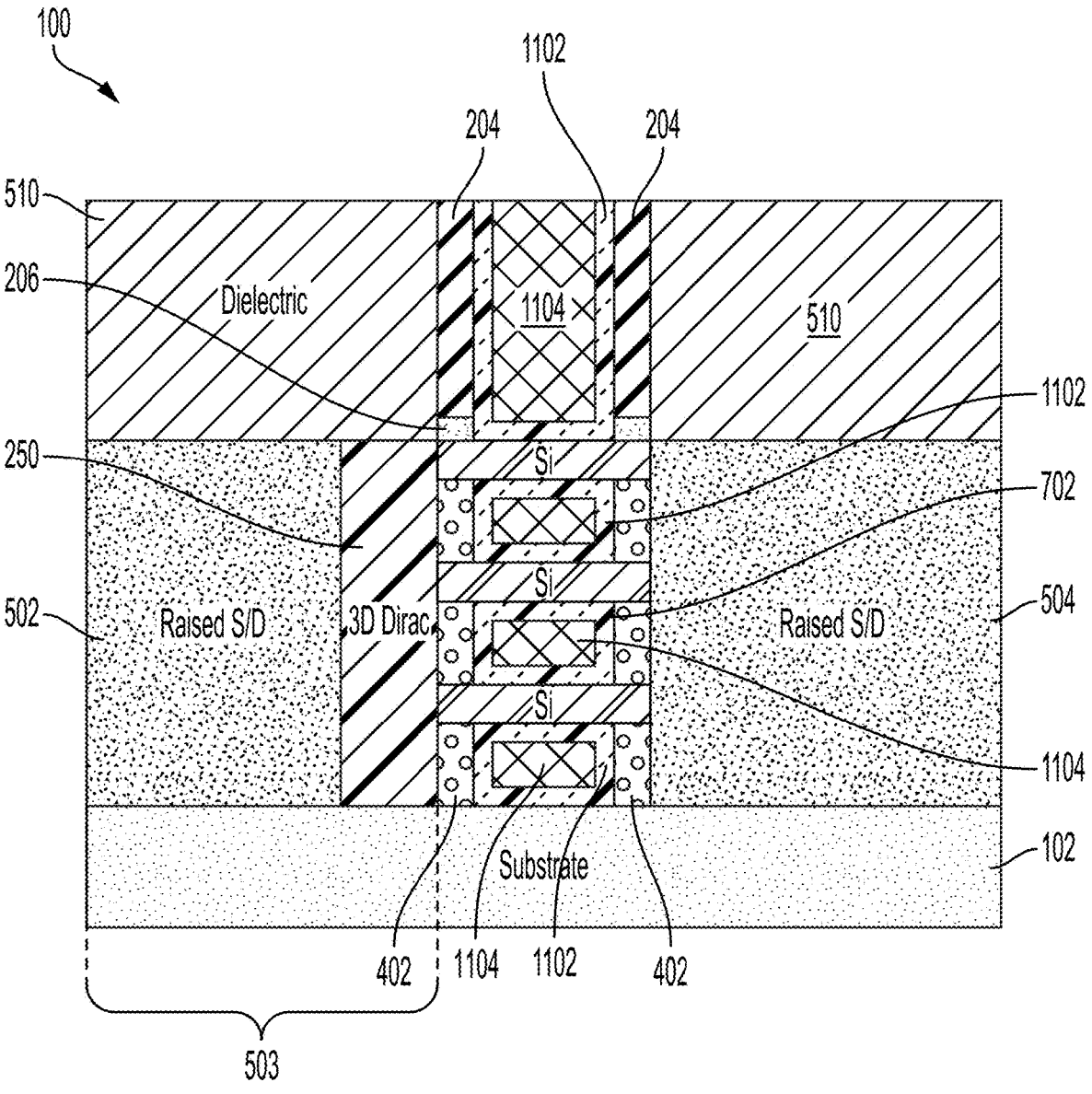

Turning to FIG. 8, known fabrication operations have been used to replace the removed sacrificial nanosheet layers 122, 124, 126 and the removed dummy gate 202 with a dielectric layer 1102 and a gate structure 1104 (e.g., a metal gate). The dielectric layer 1102 can include interfacial layers (IL) and high-k dielectric layers. In some embodiments of the disclosure, the high-k dielectric layers can modify the work function of the gate structure 1104. The high-k dielectric layer can be made of, for example, silicon oxide, silicon nitride, silicon oxynitride, boron nitride, high-k materials, or any combination of these materials. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k materials can further include dopants such as lanthanum and aluminum. In embodiments of the disclosure, the gate structure 1104 can include metal liners (not shown) and work-function metals (WFMs) (not shown). In embodiments of the disclosure, the WFM can be, for example, TiN or TaN, and the gate structure 1104 can be aluminum or tungsten.

In the semiconductor structure 100 shown in FIG. 8, the dielectric layers 1102 and the gate structure 1104 surround the nanosheet channels 112, 114, 116 and regulate electron flow through the nanosheet channels 112, 114, 116 between the first S/D 502 and the second S/D 504.

Figure 9:
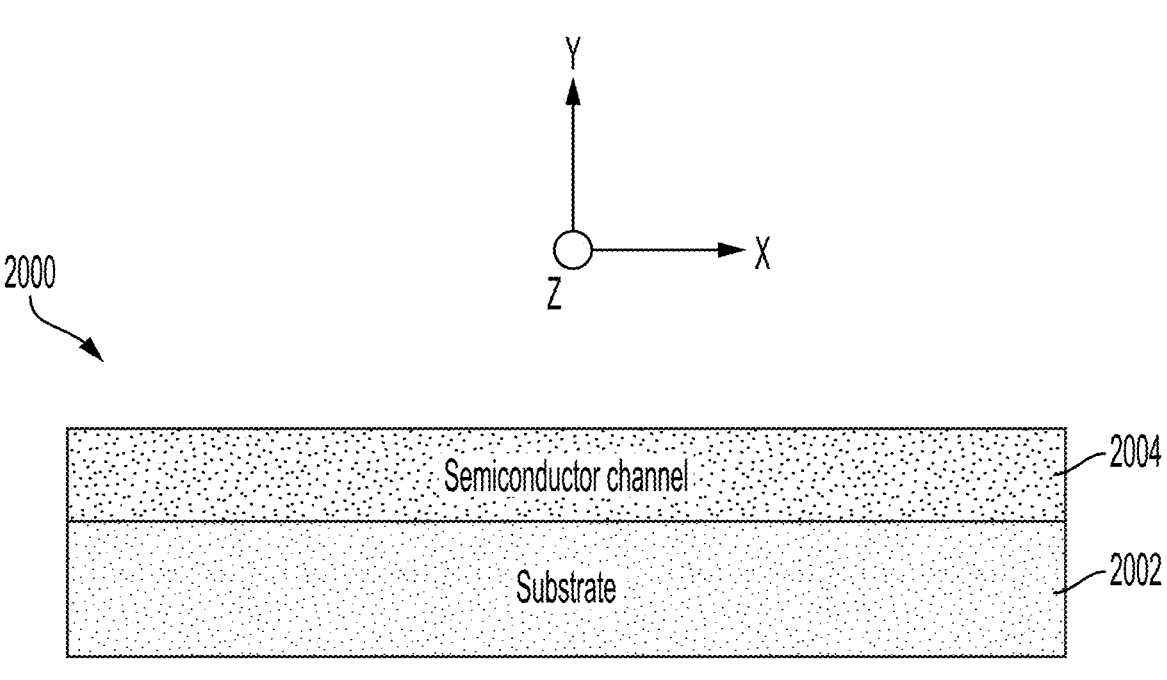

With reference now to FIGS. 9-17, a semiconductor structure 2000 (e.g., a planar structure) is illustrated after various fabrication operations for providing a steep-switching transistor including a three-dimensional Dirac energy filter in accordance with non-limiting embodiments of the present disclosure. As shown in FIG. 9, the semiconductor structure includes a channel 2004 (e.g., a semiconductor channel) formed on a substrate 2002 (e.g., a semiconductor substrate). Examples of channel and substrate materials include, but are not limited to, Si, SiGe and III-V compound semiconductors, such as InGaAs, GaAs, InP and GaN.

In one or more non-limiting embodiments of the disclosure, the substrate 2002 includes a bulk silicon (Si) material. Alternatively, the substrate 2002 can be implemented in a semiconductor-on-insulator (SOI) configuration. Other suitable semiconductor materials can be used as the substrate 2002, including but not limited to monocrystalline silicon (Si), silicon germanium (SiGe), III-V compound semiconductors, II-VI compound semiconductors, and the like. In some non-limiting embodiments of the disclosure where the substrate 2002 is an SOI configuration, the substrate 2002 includes a buried oxide layer (not depicted). The buried oxide layer can be made of any suitable dielectric material, such as, for example, a silicon oxide.

Figure 10:
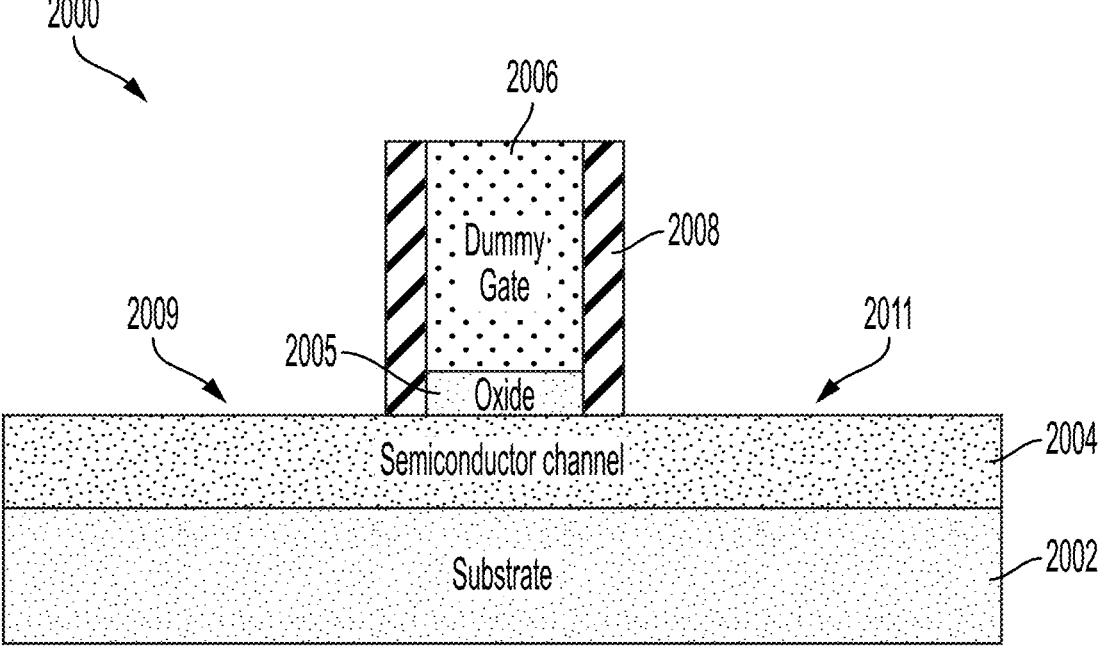

In FIG. 10, known fabrication operations have been used to form a gate oxide layer 2005, a dummy gate 2006, and gate spacers 2008 over a selected portion of the channel 2004. According a non-limiting embodiment of the present disclosure, the gate oxide layer 2005 can be formed by depositing an oxide material everywhere on the channel 2004. In one or more non-limiting embodiments, the oxide material can be deposited conformally using any suitable conformal deposition process (e.g., atomic layer depositions (ALD)), and can include interfacial layers (IL) and high-k dielectric layers. The oxide material is then etched in subsequent fabrication operations to form the gate oxide layer 2005.

A layer of amorphous silicon (a-Si) (not shown) is deposited over the gate oxide layer 2005. The a-Si layer is planarized then patterned (e.g., using a hard mask (not shown)) and etched using, for example, a dry etch, or a combination of sequential dry and wet etches to form the dummy gate 2006. Accordingly, the exposed portion of the substrate 2002 define a first source/drain (S/D) region 2009 and a second S/D region 2011. In at least one non-limiting embodiment, the first S/D region 2009 serves as a source region for supporting the source of the transistor and the second S/D region 2011 serves as a drain region for supporting the drain of the transistor. It should be appreciated, however, that the first S/D region 2009 can support the drain and the second S/D region 2011 can support the source without departing from the scope of the present disclosure.

The gate spacers 2008 are formed on sidewalls of the dummy gate 2006 using, for example, CVD, PECVD, ALD, PVD, chemical solution deposition, or other like processes in combination with a wet or dry etch process. In embodiments of the disclosure, the gate spacers 2008 can be SiN, SiBCN, or other similar materials. Accordingly, the oxide layer 2005, the dummy gate 2006, and the gate spacers 2008 can serve as a mask to protect the covered portion of the channel 2004.

Figure 11:
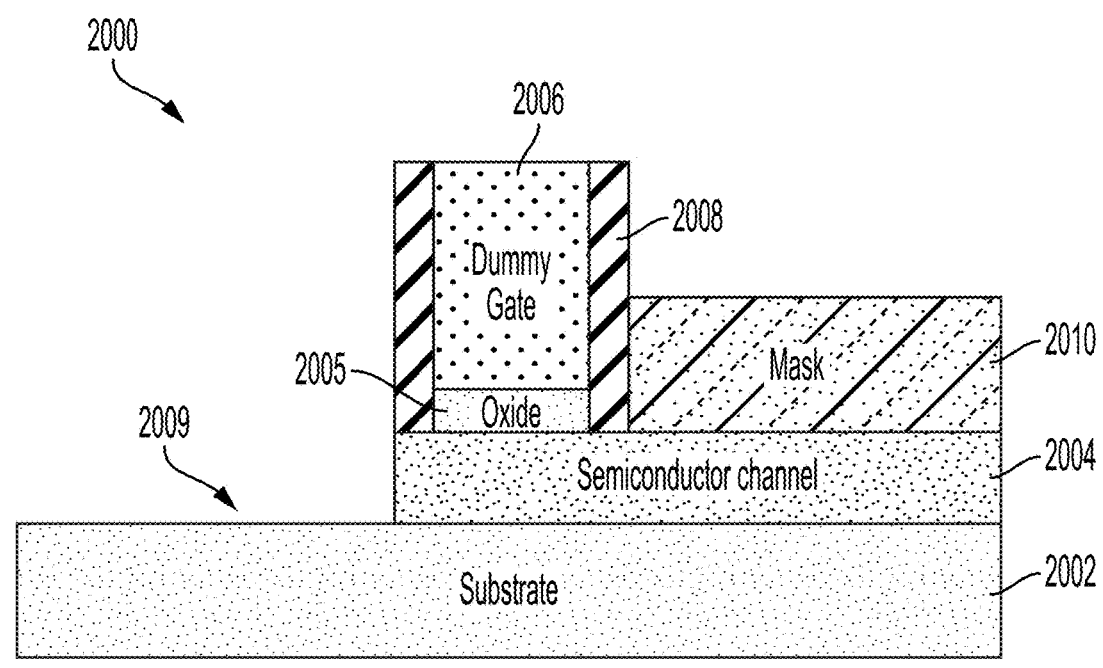

In FIG. 11, the semiconductor structure 2000 is shown following formation of a S/D mask 2010 that covers the second S/D region 2011. The S/D mask 2010 can be formed by depositing an oxide material everywhere on the semiconductor structure 2000, and then patterning the oxide material to expose the first S/D region 2009. In one or more non-limiting embodiments, the oxide material can be deposited conformally using any suitable conformal deposition process (e.g., atomic layer depositions (ALD)), and can include interfacial layers (IL) and high-k dielectric layers.

Figure 12:
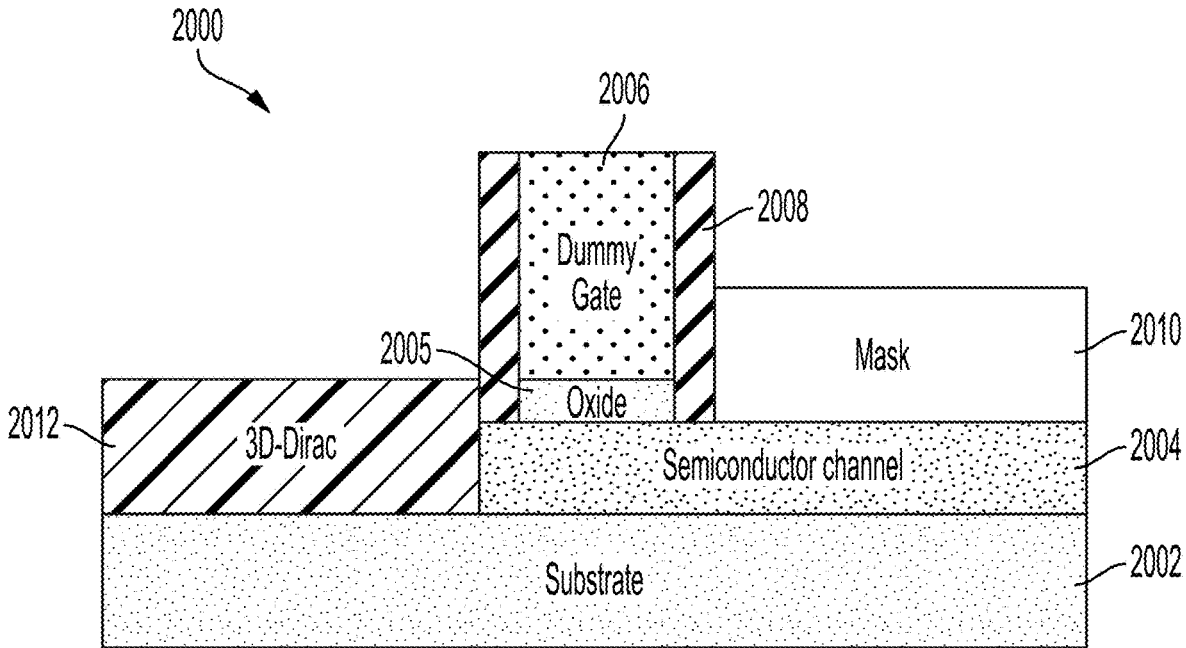

In FIG. 12, the semiconductor structure 2000 is illustrated after forming a 3D Dirac energy filter 2012 in the first S/D region 2009 (e.g., the source region). As described herein, the 3D Dirac energy filter 2012 can serve as a Dirac "cold source" capable of providing charge carriers (electrons or holes) that are injected from a linear energy band, that is from a carrier distribution which contains fewer hot electrons compared to traditional source materials such as semiconductors and metals, which is a beneficial attribute for reducing power consumption.

According to a non-limiting embodiment of the present disclosure, the 3D Dirac energy filter 2012 is formed by epitaxially growing a 3D material from an upper surface of the exposed portion of the first S/D region 2009 (e.g., the exposed semiconductor substrate 2002). Various known epitaxy techniques described herein can be utilized to grow the 3D Dirac energy filter 2012. The 3D material used to form the 3D Dirac energy filter 2012 can include, but is not limited to, cobalt monosilicide (CoSi), Calcium arsenide ($Ca_3As_2$), niobium phosphate (NbP), tungsten phosphide ($WP_2$), Molybdenum Phosphide ($MoP_2$), and Bismuth (Bi).

According to a non-limiting embodiment, the 3D Dirac energy filter 2012 can have a vertical thickness or "height" (e.g., a extending along the Y-axis) ranging, for example, from about 10 nm to about 80 nm. As shown in FIG. 12, a portion of the 3D Dirac energy filter 2012 (e.g., an end region) can directly contact the semiconductor channel 2004 and can have a vertical thickness that extends above the semiconductor channel 2004.

Figure 13:
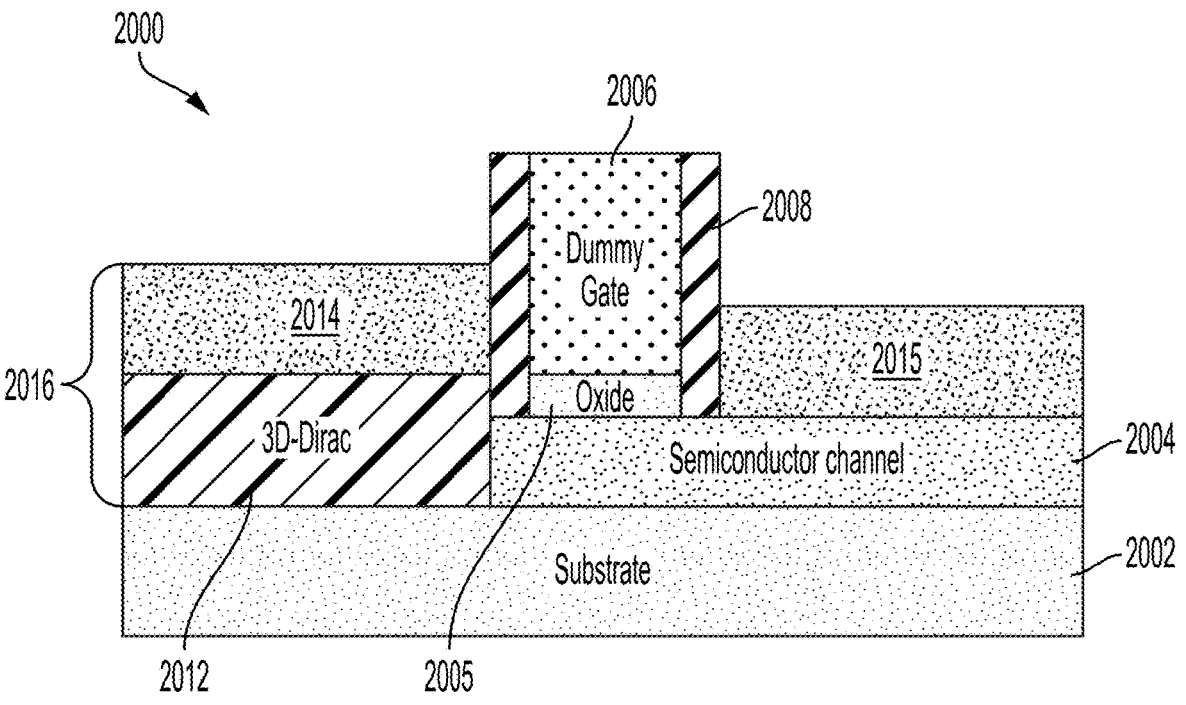

Turning to FIG. 13, the mask 2010 is removed to expose the second S/D region 2011. Accordingly, a first S/D 2014 is formed in the first S/D region 2009 and a second S/D 2015 is formed in the second S/D region 2011. The first S/D 2014 can be epitaxially grown from the upper surface of the 3D Dirac energy filter 2012, and the second S/D 2015 can be epitaxially grown from the upper surface of the exposed semiconductor substrate 2002 (e.g., the exposed semiconductor channel 2004). As described herein, the epitaxial materials used to form the first S/D 2014 and the second S/D 2015 can be grown from gaseous or liquid precursors, and can be grown using vapor-phase epitaxy (VPE), molecular-beam epitaxy (MBE), liquid-phase epitaxy (LPE), or other suitable process. In one or more non-limiting embodiments of the present disclosure, the epitaxial material can include, but is not limited to, (Si), (SiGe), and/or carbon doped silicon (Si: C). The epitaxial material can be doped during deposition (in-situ doped) by adding dopants, n-type dopants (e.g., phosphorus or arsenic) or p-type dopants (e.g., boron or gallium), depending on the type of transistor.

With continued reference to FIG. 13, the 3D Dirac energy filter 2012 and the first S/D 2014 define a stacked S/D 2016 (e.g., vertically stacked S/D), where the first S/D 2014 is formed asymmetrically (e.g., along the X-axis) with respect to the second S/D 2015. According to a non-limiting embodiment, the top surface of the second S/D 2015 is located below the upper surface of the first S/D 2014. In at least one non-limiting embodiment, the top surface of the second S/D 2015 is aligned (e.g., along the X-axis) with the bottom surface of the first S/D 2014. The asymmetrical arrangement of the 3D Dirac energy filter 2023 prevents electron filter from occurring at the second S/D region (e.g., to avoid drain-side electron filtering). Drain-side electron filtering reduces the number of electrons passing through the channel, and therefore the transistor current, while not providing a benefit of reduced subthreshold swing, hence it is unwanted. In addition, the asymmetrical arrangement (e.g., along the X-axis) can serve as a sort of physical signature of the process for providing a steep-switching transistor including a three-dimensional Dirac energy filter as described herein.

Figure 14:
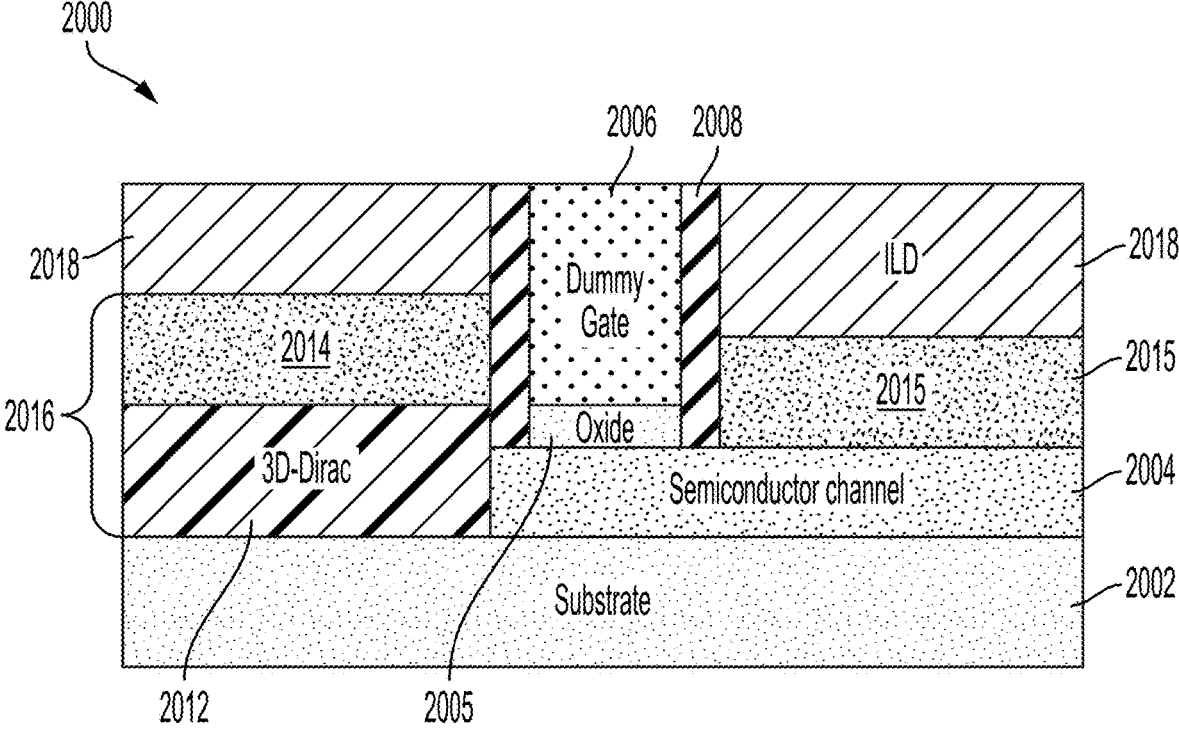
Figures 15, 16:
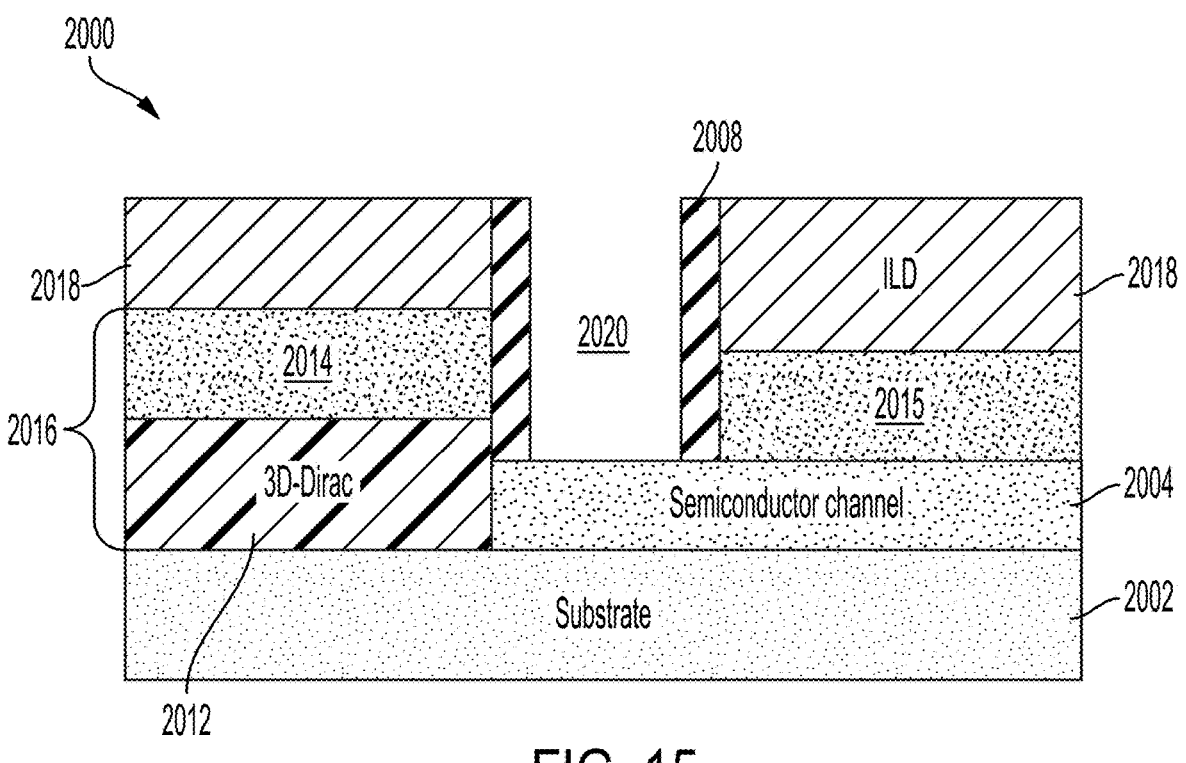

In FIG. 14, an interlayer dielectric (ILD) 2018 is deposited on the semiconductor structure 2000. The interlayer dielectric (ILD) 2018 can include various dielectric materials including, but not limited to, silicon dioxide (SiO2), fluorinated silicon dioxide (SiOF), carbon-doped oxides, and organic polymers. The ILD material can be deposited using various known techniques including, but not limited to, chemical vapor deposition (CVD), plasma-enhanced CVD (PECVD) and low-pressure CVD (LPCVD). In one or more non-limiting embodiments, the ILD 2018 can be planarized using a chemical-mechanical planarization (CMP) technique to expose an surface of the dummy gate 2006. The dummy gate 2006 can then be removed to expose a gate trench 2020 using various techniques such as, for example, a reactive ion etch (RIE) or chemical oxide removal (COR) process, as shown in FIG. 15. Accordingly, a gate trench 2020 is formed between the opposing gate spacers 2008.

Turning to FIG. 16, known fabrication operations have been used to replace the removed dummy gate 2006 with an interfacial layer/dielectric layer 2024, a WFM layer 2026, and a gate structure 2022 (e.g., a metal gate). The interfacial layer/dielectric layer 2024 can be formed of SiO2 or a high-k material having a high dielectric constant (k) greater than about 5, and even ranging from about 10 to over 100. Examples of high-k materials include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate.

The WFM layer 2026 is formed on the interfacial layer/dielectric layer 2024, and serves to adjust the work function of the gate structure 2022. The WFM layer 2026 can be formed from various work function metals including, but not limited to, tungsten (W), tungsten-based meal alloys, tantalum nitride (TaN), and titanium nitride (TiN).

The gate structure 2022 can include metal liners (not shown) and work-function gate liners (not shown). The gate structure 2022 can be formed from various metal materials including, but not limited to, aluminum (Al) or tungsten (W). In a non-limiting embodiment of the present disclosure, the gate trench 2020 can be overfilled with the metal material, and a CMP process can then be performed to recess the metal material while stopping on an upper surface of the ILD 2014. In this manner, the gate structure 2022 is formed with its upper surface being planar or "flush" with the upper surface of the ILD 2014.

Figure 17:
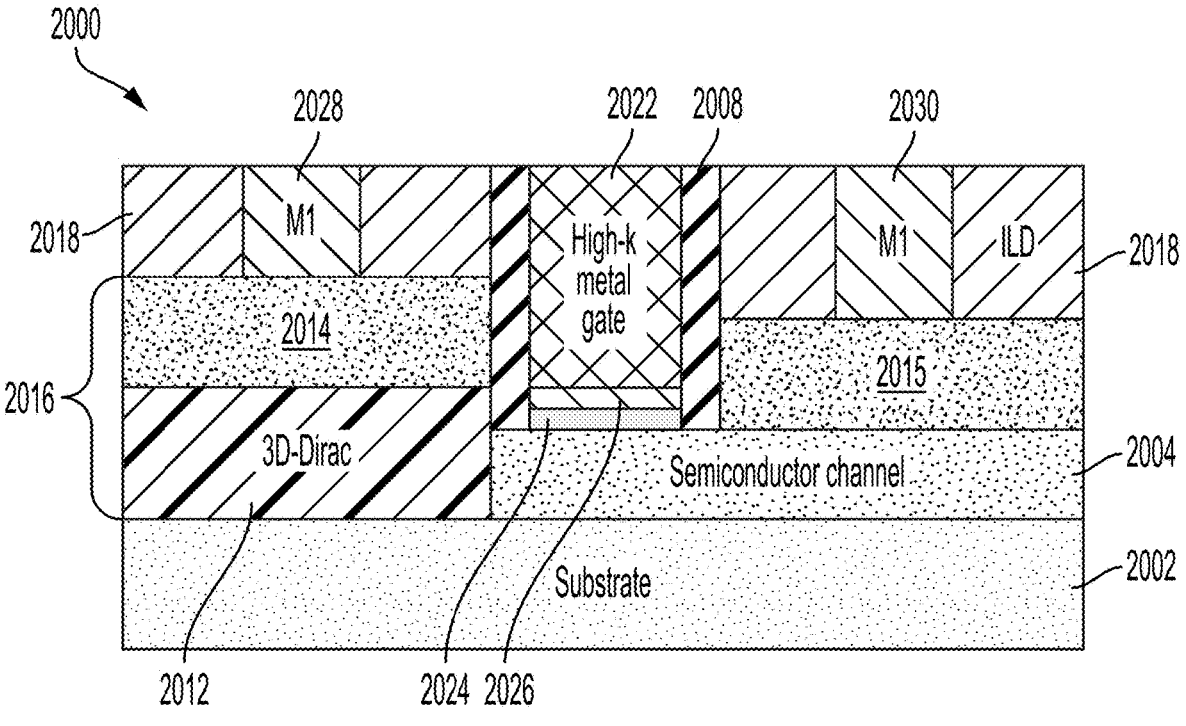

In FIG. 17, the semiconductor structure 2000 is shown after forming a first S/D contact 2028 on the first S/D 2014 and a second S/D contact 2030 on the second S/D 2015. The first and second S/D contacts 2028 and 2030 can be formed by patterning the ILD 2014 to form first and second contact trenches (not shown) that expose a portion of the underlying first and second S/Ds 2014 and 2015. A metal material can be deposited in first and second trenches and directly onto the first and second S/Ds 2014 and 2015 to establish electrical conductivity therewith. A CMP process can be performed so that the upper surface first and second S/D contacts 2028 and 2030 are planar (e.g., flush) with the upper surface of the ILD 2014.

As described herein, fabrication methods and resulting structures form a semiconductor structure that can establish a steep-switching transistor, which implements a three-dimensional (3D) Dirac energy filter. The 3D Dirac energy filter is formed from a 3D Dirac material, which can operate as a reduced temperature element or "cold source". The 3D Dirac energy filter is formed in a source/drain region of the transistor so that it can perform energy filtering by performing as a Fermi-filter that filters out hot carriers from entering the transistor channel. In addition, the Dirac energy filter is formed with an asymmetrical design, i.e., is formed in a first source/drain region (e.g., the source region), but not in a second source/drain region (e.g., the drain region)

The methods and resulting structures described herein can be used in the fabrication of IC chips. The resulting IC chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes IC chips, ranging from toys and other low-end applications to advanced computer products having a display, a keyboard or other input device, and a central processor.

Various embodiments of the present disclosure are described herein with reference to the related drawings. Alternative embodiments can be devised without departing from the scope of this disclosure. Although various connections and positional relationships (e.g., over, below, adjacent, etc.) are set forth between elements in the detailed description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present disclosure is not intended to be limiting in this respect. Similarly, the term "coupled" and variations thereof describes having a communications path between two elements and does not imply a direct connection between the elements with no intervening elements/connections between them. All of these variations are considered a part of the specification. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

The terms "about," "substantially," "approximately," and variations thereof, are intended to include the degree of error associated with measurement of the particular quantity based upon the equipment available at the time of filing the application. For example, "about" can include a range of #8% or 5%, or 2% of a given value.

The phrase "selectively etched" or "selective to," such as, for example, "a first element selective to a second element," means that the first element can be etched and the second element can act as an etch stop.

The term "conformal" (e.g., a conformal layer) means that the thickness of the layer is substantially the same on all surfaces, or that the thickness variation is less than 15% of the nominal thickness of the layer.

As previously noted herein, for the sake of brevity, conventional techniques related to semiconductor device and IC fabrication may or may not be described in detail herein. By way of background, however, a more general description of the semiconductor device fabrication processes that can be utilized in implementing one or more embodiments of the present disclosure will now be provided. Although specific fabrication operations used in implementing one or more embodiments of the present disclosure can be individually known, the described combination of operations and/or resulting structures of the present disclosure are unique. Thus, the unique combination of the operations described in connection with the fabrication of a semiconductor device according to the present disclosure utilize a variety of individually known physical and chemical processes performed on a semiconductor (e.g., silicon) substrate, some of which are described in the immediately following paragraphs.

In general, the various processes used to form a semiconductor device, transistor, and/or micro-chip that will be packaged into an IC fall into four general categories, namely, material deposition, removal/etching, semiconductor doping, and patterning/lithography. Material deposition is any process that grows, coats, or otherwise transfers a material onto the wafer. Available technologies include physical vapor deposition (PVD), chemical vapor deposition (CVD), electrochemical deposition (ECD), various types of atomic layer deposition (ALD, sputtering, and epitaxial growth.

Epitaxial materials can be grown from gaseous or liquid precursors. Epitaxial materials can be grown using vapor-phase epitaxy (VPE), molecular-beam epitaxy (MBE), liquid-phase epitaxy (LPE), or other suitable process. Epitaxial silicon, silicon germanium, and/or carbon doped silicon (Si:C) silicon can be doped during deposition (in-situ doped) by adding dopants, n-type dopants (e.g., phosphorus or arsenic) or p-type dopants (e.g., boron or gallium), depending on the type of transistor.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases are controlled and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. For example, an epitaxially grown semiconductor material deposited on a {100} orientated crystalline surface will take on a {100} orientation. In some embodiments, epitaxial growth and/or deposition processes are selective to forming on semiconductor surfaces, and generally do not deposit material on exposed surfaces, such as silicon dioxide or silicon nitride surfaces.

Removal/etching is any process that removes material from the wafer. Examples include etch processes (either wet or dry), chemical-mechanical planarization (CMP), and the like. Reactive ion etching (RIE), for example, is a type of dry etching that uses chemically reactive plasma to remove a material, such as a masked pattern of semiconductor material, by exposing the material to a bombardment of ions that dislodge portions of the material from the exposed surface. The plasma is typically generated under low pressure (vacuum) by an electromagnetic field. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and diagrams in the Figures illustrate possible implementations of fabrication and/or operation methods according to various embodiments of the present disclosure. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present disclosure have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of fabricating a semiconductor structure comprising:

forming a nanosheet stack over a substrate, the nanosheet stack including alternating layers of channel nanosheets and sacrificial nanosheets between a first source/drain (S/D) region and a second S/D region;

forming a gate structure on the nanosheet stack;

forming a three-dimensional (3D) Dirac energy filter comprising a 3D Dirac material on a portion of the substrate located in the first S/D region, the 3D Dirac energy filter extending from the substrate and contacting the nanosheet stack; and forming a first S/D on the 3D Dirac energy filter in the first S/D region, and forming a second S/D on the substrate of the second S/D region.

2. The method of claim 1, wherein the 3D Dirac energy filter is formed between the first S/D and the nanosheet stack.

3. The method of claim 2, wherein the 3D Dirac material comprises at least one of cobalt monosilicide (CoSi), Calcium arsenide (Ca3As2), niobium phosphate (NbP), tungsten phosphide (WP2), Molybdenum Phosphide (MoP2), and Bismuth (Bi).

4. The method of claim 3, wherein forming the 3D Dirac energy filter comprises epitaxially growing the 3D Dirac material from the channel nanosheets and the substrate located in the first S/D region.

5. The method of claim 1, wherein the channel nanosheets comprise silicon (Si) and the sacrificial nanosheets comprise silicon germanium (SiGe).

6. The method of claim 1, wherein the 3D Dirac energy filter is formed against an end region of all the channel nanosheets included in the nanosheet stack.

7. The method of claim 1, wherein the first S/D is formed to have a first size and the second S/D is formed to have a second size different from the first size of the first S/D.

* * * * *